United States Patent
Duineveld et al.

(10) Patent No.: US 7,102,280 B1
(45) Date of Patent: Sep. 5, 2006

(54) ORGANIC ELECTROLUMINESCENT DEVICE AND A METHOD OF MANUFACTURING THEREOF

(76) Inventors: Paulus Cornelis Duineveld, Prof. Holstlaan 6, 5656 AA Eindhoven (NL); Cornelis Dirk Roelandse, Prof. Holstlaan 6, 5656 AA Eindhoven (NL); Jeroen Johannes Marinus Vleggaar, Christinastraat 24, 5615 RK Eindhoven (NL)

(*) Notice: Subject to any disclaimer, the term of this patent is extended or adjusted under 35 U.S.C. 154(b) by 431 days.

(21) Appl. No.: 09/890,364

(22) PCT Filed: Nov. 23, 2000

(86) PCT No.: PCT/EP00/11706

§ 371 (c)(1), (2), (4) Date: Jul. 30, 2001

(87) PCT Pub. No.: WO01/41229

PCT Pub. Date: Jun. 7, 2001

(30) Foreign Application Priority Data

Nov. 29, 1999 (EP) .............................. 99204018

(51) Int. Cl.
  *H01J 1/62* (2006.01)
  *H01J 9/22* (2006.01)
  *B05D 5/06* (2006.01)

(52) U.S. Cl. ........................ 313/504; 313/505; 313/506; 445/23; 445/24; 428/917; 427/66

(58) Field of Classification Search ................ 313/504, 313/505, 506; 428/690, 917, 212; 315/169.3; 427/66; 445/23, 24
See application file for complete search history.

(56) References Cited

U.S. PATENT DOCUMENTS

| 4,104,070 | A   |   | 8/1978  | Moritz et al. .................. 96/36 |
|-----------|-----|---|---------|----------------------------------------|
| 6,208,074 | B1  | * | 3/2001  | Ilegems et al. ............. 313/504    |
| 6,388,377 | B1  | * | 5/2002  | Kobayashi et al. ......... 313/505      |
| 6,503,831 | B1  | * | 1/2003  | Speakman .................. 438/674      |
| 2004/0201048 | A1 | * | 10/2004 | Seki et al. .................. 257/294   |

FOREIGN PATENT DOCUMENTS

| EP | 0880303     |   | 11/1998 |
|----|-------------|---|---------|
| WO | WO9921936   |   | 5/1999  |
| WO | WO99/48339  | * | 9/1999  |
| WO | WO0048339   |   | 8/2000  |

* cited by examiner

Primary Examiner—Nimeshkumar D. Patel
Assistant Examiner—Sharlene Leurig (57) ABSTRACT

An organic electroluminescent (EL) device (1) has at least one EL element (10) comprising an organic electroluminescent layer (6) and a relief pattern (7). The relief pattern serves to contain the fluid layer from which the EL layer (6) is obtained. In order to counteract the adverse effect the relief pattern may have on the service life of the EL device, the EL device is provided with an EL layer (6) substantially uniform in thickness. In addition, a matrix or segmented display device comprising a plurality of EL elements (10) is provided.

In a preferred method of manufacturing the EL device the fluid layer is deposited by means of ink-jet printing, dispensing or spin-coating.

10 Claims, 5 Drawing Sheets

ORGANIC ELECTROLUMINESCENT DEVICE AND A METHOD OF MANUFACTURING THEREOF

The invention relates an organic electroluminescent device having at least one electroluminescent element comprising
a first and a second electrode and, disposed therebetween, an organic electroluminescent layer provided in accordance with a desired pattern and obtained from a fluid layer,
the device further having a relief pattern for containing the fluid layer from which the organic electroluminescent layer provided in accordance with the desired pattern is obtained.

The invention further relates to a method of manufacturing such an organic electroluminescent device.

Generally, an organic electroluminescent (EL) device comprises at least a hole-injecting (an anode), an electron-injecting electrode (a cathode) and, disposed therebetween, an EL layer comprising an organic EL material. If a suitable voltage is applied to the electrodes, the organic EL layer emits light. Using different organic EL materials, the color of the light emitted can be varied.

An organic EL device can be used as a light source, in particular one having a large surface area. Organic EL devices can also be used as monochrome or multi-color display devices, such as a back light, a still image display, a segmented display device, a matrix display of the passive or active type.

In the European patent application EP-A-0880303, an organic electroluminescent device as mentioned in the opening paragraph is disclosed. The luminescent layers of the full-color organic matrix EL display device known therefrom are obtained from solution by means of inkjet printing. The EL display device has banks which prevent the solution from spreading into unwanted areas and thus serve to pattern the luminescent layers. The intensity of emitted light across the luminescent layer of any particular pixel of the EL matrix display device is said to be substantially uniform to the unaided eye and the luminescent layers are said to have favorable to extremely favorable properties.

The inventors of the present invention have observed that matrix EL display devices which, in accordance with EP-A-0880303, have luminescent layers obtained from a solution which is prevented from spreading into unwanted areas by means of banks, can have a service life which is unexpectedly low.

It is an object of the invention to provide, inter alia, an organic electroluminescent device which is improved in this respect. In particular, it is an object to select from the EL devices of the type mentioned in the opening paragraph those which have an improved service life.

This object is achieved by an organic electroluminescent device of the type mentioned in the opening paragraph which is characterized in that the electroluminescent layer is substantially uniform in thickness to the extent that the proportion of the organic electroluminescent layer having a thickness within 20% of the minimum thickness of the organic electroluminescent layer or the proportion of the organic electroluminescent layer having a thickness within 20% of the maximum thickness of the organic electroluminescent layer, is at least 0.55.

If, in accordance with the invention, the proportion is selected at least 0.55, the service life of the EL device comprising said EL layer is substantially prolonged.

Service life improves even more if either of the said proportions is at least 0.60 or, preferably, at least 0.65 or, more preferably, at least 0.70, still more preferably, at least 0.80. Most preferred at least 0.90 or 0.95.

The proportion is a measure of the uniformity in thickness of the EL layer, ranges from more than 0.0 to 1.0. If the proportion is 1.0 the EL layer is perfectly uniform in thickness. It can be determined from the thickness profile of the EL layer. The thickness profile can be routinely measured using methods well known to those skilled in the art.

As a typical example of an EL device in accordance with the invention, an EL device comprising a spin-coated poly-p-phenylene vinylene EL layer patterned using a relief pattern having a height of about 5 μm and a pitch of 300 μm in which the proportion of the EL layer having a thickness within 20% of the minimum thickness is 0.70 has substantially the same service life as that of a reference EL device which does not have the relief pattern but otherwise identical to the EL matrix display device. Specifically, the proportion of the EL layer of the reference device is about 1.0.

The invention is based on the recognition of the problem that the relief pattern adversely affects the service life of the EL device. It is further based on the insight that, due the interaction with the relief pattern, the fluid layer will generally adopt a convex or concave shape which is basically transferred to the EL layer during the process of obtaining the EL layer from the fluid layer. As a result, the EL layer is non-uniform in thickness. It is still further based on the insight that the EL layer is non-uniform in thickness to such an extent that the service life is substantially adversely affected. Unexpectedly, a substantial effect on the service life even occurs if the variation in thickness is as such not discernible to the unaided eye as a non-uniformity in emitted light intensity. Also, when examined under a microscope, the appearance of such an EL layer is very favorable, no deficiencies such as cracks are observed.

Though not to be construed as being diminutive to the nature or limiting in any way the scope of the invention, the inventors consider the adverse effect of non-uniformity of thickness to be a result of the fact that the intensity of emitted light of an EL device of the type mentioned in the opening paragraph is proportional to $1/t^n$, where t is the thickness of an EL layer and n of the order of 3 to 6, while the service life is in general roughly inversely proportional to the intensity. By way of illustration of this strong dependence, an increase in thickness of 10% reduces the intensity of emitted light by 25% (n=3) to 42% (n=6).

The inventors have found that the extent to which the EL layer is non-uniform in thickness depends, inter alia, on the height of the relief pattern used. This finding is put to technical use in the case of the organic EL devices as mentioned in the opening paragraph in which the height of the relief pattern is selected such that the electroluminescent layer is substantially uniform in thickness in the sense defined above. Better the proportion is at least 0.60 or, preferably, at least 0.65 or, more preferably, at least 0.70, still more preferably, at least 0.80. Most preferred at least 0.90 or 0.95.

The uniformity in thickness of the EL layer may be indirectly evaluated from the service life of the EL device by comparing its service life with the service life of the above-mentioned reference EL device. If the EL device has substantially the same service life as the service life of the reference EL device, then the EL layer is substantially uniform in thickness.

Furthermore, the uniformity of the EL layer may be indirectly evaluated by comparing the brightness of the EL device and the brightness of the above-mentioned reference EL device. The computation of the brightness of the EL device from the measured intensity is based on the area of the EL layer which is active in light emission. Generally, this area is the area of overlap of the first and the second electrode and the EL layer. If, after correcting, inter alia, for the area of the EL layer which is active in light emission, the EL device has substantially the same brightness as the brightness of the reference EL device, the relief pattern has a height selected such that the EL layer is substantially uniform in thickness.

The (non-)uniformity of the EL layer is a result of the interaction between fluid layer and the relief pattern, and is more relevant the smaller the area occupied by the fluid layer. It is particularly relevant in EL matrix display devices having a pitch of less than 500 µm, more particularly less than 300 µm, or, even more particularly, 150 µm or less. The problem is further exacerbated if the matrix display is driven in a multiplexed manner.

If the thickness uniformity of the EL layer is still a determining factor with respect to the service life or the light emitted across the EL layer is considered insufficiently uniform in intensity, which is particularly relevant in case the surface area of the EL layer is large, the requirement of 20% within the minimum/maximum thickness may be tightened to, for example, 15% or 10% or less. The requirement may also be tightened if the probability of occurrence of short-circuits is unacceptably large. On the other hand, if the service life of the EL device for a particular application is more than adequate while e.g. the yield of production of EL devices needs to be improved, the requirement may be relaxed to 25%, 30%, 35%, or 40% or higher.

The EL layer is made of a substantially organic, electroluminescent material. Suitable such materials include organic photo- or electroluminescent, fluorescent and phosphorescent compounds of low or high molecular weight. Preferred are materials including EL polymers having a substantially conjugated backbone (main chain), such as polythiophenes, polyphenylenes, polythiophenevinylenes, or, more preferably, poly-p-phenylenevinylenes. Particularly preferred are (blue-emitting) poly(alkyl)fluorenes and poly-p-phenylenevinylenes which emit red, yellow or green light and are 2-, or 2,5-substituted poly-p-phenylenevinylenes, in particular those having solubility-improving side groups at the 2- and/or 2,5 position such as $C_1$–$C_{20}$, preferably $C_4C_{10}$, alkyl or alkoxy groups. Preferred side groups are methyl, methoxy, 3,7-dimethyloctyloxy, and 2-methylpropoxy. More particularly preferred are polymers including a 2-phenyl-1,4-phenylenevinylene repeating unit, the phenyl group being optionally substituted with alkyl and/or alkoxy groups of the type above, in particular methyl, methoxy, 3,7-dimethyloctyloxy, or, better still, 2-methylpropoxy. The organic material may contain one or more of such compounds.

In the context of the invention, the term organic includes polymeric whereas the term polymer and affixes derived therefrom, includes homopolymer, copolymer, terpolymer and higher homologues as well as oligomer.

Optionally, the organic EL material contains further substances, organic or inorganic in nature, which may be homogeneously distributed on a molecular scale or present in the form of a particle distribution. In particular, compounds improving the charge-injecting and/or charge-transport capability of electrons and/or holes, compounds to improve and/or modify the intensity or color of the light emitted, stabilizers, and the like may be present.

The organic EL layer preferably has an average thickness of 50 nm to 200 nm, in particular, 60 nm to 150 nm or, preferably, 70 nm to 100 nm.

Generally, the EL device comprises a substrate situated on the side of the first electrode facing away from the second electrode. Preferably, the substrate is transparent with respect to the light to be emitted. Suitable substrate materials include transparent synthetic resin which may or may not be flexible, quartz, ceramics and glass.

The first and the second electrode may be an electron-injecting electrode and a hole-injecting electrode, respectively. Preferably, the first and the second electrode is the hole-injecting and the electron-injecting electrode, respectively. The electron-injecting electrode is suitably made of a metal (alloy) having a low work function, such as Yb, Ca, Mg:Ag Li:Al, Ba or is a laminate of different layers such as Ba/Al or Ba/Ag electrode.

The hole-injecting electrode is suitably made of a metal (alloy) having a high work function such as Au, Pt, Ag. Preferably, a more transparent hole-injecting electrode material, such as an indiumtinoxide (ITO), is used. Conductive polymers such as a polyaniline (PANI) and a poly-3,4-ethylenedioxythiophene (PEDOT) are also suitable transparent hole-injecting electrode materials. Preferably, a PANI layer has a thickness of 50 to 200 nm, and a PEDOT layer 100 to 300 nm. If an ITO hole-injecting electrode is used, the first electrode is preferably the hole-injecting electrode.

The relief pattern enables the EL layer to be obtained from the fluid layer in accordance with a pattern. The relief pattern serves to contain the fluid layer and thus prevents the fluid from spreading into unwanted areas. The relief pattern accurately delimits the boundary of the fluid layer and thus, indirectly, the outline of the EL layer. For the purpose of obtaining a relief pattern capable of containing the fluid layer per se, its specific transverse profile, width, and height is not critical. A relief pattern can even contain a fluid layer which has a height as much as 6 times the height of the relief pattern. A suitable width is 1 to 50 µm, or, preferably 10 to 20 µm, a suitable height 1 to 30 µm, a preferable height 2 to 6 µm. The transverse profile of the relief pattern is suitably rectangular, although a relief pattern of which the side-walls have a positive or negative slope are preferred.

Although any patterning technique may be used to provide the relief pattern, the relief pattern is preferably obtained by photolithographically patterning a conventional photoresist.

The invention essentially relates to organic EL devices of which the organic EL layer is obtained from a fluid. As is known in the art, obtaining the EL layer from a fluid is a simple and cost-effective method which does not involve the use of expensive equipment such as vacuum equipment. EL devices in which the EL layer is obtained from a fluid layer contained by a relief pattern can be recognized by a (slightly) convex or concave shape. Alternatively, from the material of which the EL layer is made it can be established if an EL layer is deposited from a fluid. For example, if the EL layer is made of an organic material As which includes a soluble compound of high-molecular weight such as a polymer, the EL layer is almost certainly obtained from a fluid layer.

The fluid layer from which the organic EL layer is obtained comprises the organic EL material or a precursor material thereof. The fluid layer may take any suitable form such as a solution, a dispersion, an emulsion or a paste. After the fluid layer has been deposited it is converted to the organic EL layer. The conversion may involve exposing, if required in an inert atmosphere, the fluid layer to increased or reduced temperatures, increased or reduced pressure, and/or radiation. Preferably, the conversion is performed at an elevated temperature.

If the organic EL material is present as such in the fluid layer, it may be sufficient to evaporate a solvent and/or other volatile components. If the fluid layer contains a precursor material of the organic EL material the conversion also involves a chemical reaction. The wealth of chemical reactions known to those skilled in the art of chemistry may be exploited to derive suitable precursor materials. A preferred precursor material contains leaving groups which are eliminated during the conversion. An example is the conversion of a poly-p-phenylenevinylene in which at least part of the vinylene groups is replaced with ethanediyl groups carrying a leaving group such as an alkoxy, halogen or a sulfonium group. When thermally converted, the leaving group is eliminated and a vinylene group is formed.

The fluid layer may contain further substances. For example, substances which modulate its theological properties such as viscosity, (visco)elasticity, contact angle and/or wettability. Wetting agents, leveling agents, surfactants, thickening agents, diluents and the like may be added.

Optionally, the EL device comprises additional layers disposed between the electrodes. Such additional layers include hole-injecting and/or transport (HTL) layers and electron-injecting and transport (ETL) layers. Preferred are EL devices which comprise a laminate of anode/HTL layer/EL layer/cathode, anode/EL layer/ETL layer/cathode, or, anode/HTL layer/EL layer/ETL layer/cathode.

Suitable materials for the hole-injecting and/or hole-transport layers (HTL) include aromatic tertiary amines, in particular diamines or higher homologues, polyvinylcarbazole, quinacridone, porphyrins, phthalocyanines, poly-aniline and poly-3,4-ethylenedioxythiophene.

Suitable materials for the electron-injecting and/or electron-transport layers (ETL) are oxadiazole-based compounds and aluminiumquinoline compounds.

If ITO is used as the anode, the EL device preferably comprises a 50 to 300 nm thick layer of the hole-injecting/-transport layer material poly-3,4-ethylenedioxythiophene or a 50 to 200 nm thick layer of polyaniline.

The relief pattern may also serve to pattern the additional layers of the organic EL device. This is preferred when the relief pattern is a photoresist pattern and the additional layers are organic, because the process of obtaining the photoresist relief pattern is in general detrimental to previously deposited organic layers.

If the relief pattern is used to pattern an additional layer and this additional layer is deposited from a fluid layer, the service life of the EL device comprising the additional layer is improved if the additional layer is also substantially uniform in thickness in the sense defined above or, better, at least 0.60 or, preferably, at least 0.65 or, more preferably, at least 0.70, still more preferably, at least 0.80. Most preferred at least 0.90 or 0.95.

The relief pattern may or may not be used to pattern the second electrode. If the relief pattern has a transverse profile which is rectangular or, preferably, trapezoidal with positive slopes (broad side facing the first electrode), the second electrode forms, if deposited by means of a vapor in vacuo, a single continuous electrically conductive layer covering both the relief pattern and the EL layer. If the second electrode is to be patterned an external shadow mask may be used.

In order to prevent any liquid which is initially deposited on top of the relief pattern from remaining there, draining means may be employed such as a relief pattern having a roof-like or gutter-like structure.

A preferred embodiment of the EL device in accordance with the invention is characterized in that the relief pattern or a part thereof has a transverse profile having an overhanging section rendering the relief pattern suitable for patterning the second electrode such as a T-profile.

If the second electrode is deposited by means of vacuum deposition, which is generally the case, the relief pattern or a part thereof may conveniently serve as a shadow mask for the deposition of the second electrode if the relief pattern is provided with an overhanging section. When exposed to the material flux from which the second electrode is deposited in vacuo, the overhanging section prevents the deposition of electrode material at the locations which are in the shadow region provided by the overhanging section thus obtaining a patterned second electrode. Examples of relief patterns having an overhanging section are relief patterns having a T-, a mushroom-, or an inverse trapezoidal- or triangular-shaped transverse profile. The width of the overhanging section is not critical. In overhanging sections of 1 to 2 μm or less the risk of two neighboring second electrodes being electrically connected unintentionally is unacceptable. A suitable width of the overhanging section is 2 to 10 μm. A preferred relief pattern has an inverse trapezoidal transverse profile with a base of 5 to 10 μm and a top of 15 to 30 μm. If the substrate is not rotating during the deposition process of the second electrode, the overhanging section may be even smaller.

In a first method of producing a relief pattern having an overhanging section, a layer of a conventional positive photoresist is subjected to both a pattern-wise exposure of high energy and a flood exposure of low energy. The pattern-wise exposure is performed in the normal manner, the normal manner being that the light source is positioned on the side of the first electrode facing the EL layer, whereas the flood exposure is performed with the light source positioned on the other side of the EL layer. The flood exposure is effective only when the first electrode and, if present, the substrate is transparent to the light of the flood exposure. After development, a relief pattern having an overhanging section is obtained. The first method is particularly suitable for obtaining relief patterns having a height of more than 12 μm.

In a second method, a conventional negative resist is underexposed and/or overdeveloped. This second method is capable of producing inverse trapezoidal or triangular profiles having a negative inclination of up to 45°.

In a third method, a conventional positive novolac-based photoresist is processed according to a method which is known in the art as image reversal, see e.g. U.S. Pat. No. 4,104,070. The third method is particularly suitable to obtain a relief pattern having a height of 1 to 10 μm or, more particularly, 2 to 5 μm.

A particularly suitable embodiment of the EL device is characterized in that the relief pattern is a composite relief pattern of a first relief pattern for containing the fluid layer and a second relief pattern having an overhanging section rendering the second relief pattern suitable for patterning the second electrode.

The second relief pattern is situated on the side of the first relief pattern facing the second electrode. Such a composite relief pattern can be obtained by performing two photolithographic patterning steps in succession starting with the first relief pattern. The first relief pattern is hard-baked so as to be able to withstand the processing required to provide the second pattern. Alternatively, the first relief pattern may be made of a polyimide or a polyamide or any other photo-patternable material which is not soluble in solvents used to process photo-resists of the second relief pattern.

In a particularly preferred embodiment of the EL device, the organic electroluminescent device comprises a plurality of independently addressable electroluminescent elements (pixels).

In order to obtain an improved service life for all EL elements, each individual EL element (pixel) is characterized in that the electroluminescent layer is substantially uniform in thickness in the sense defined above or, better, at least 0.60 or, preferably, at least 0.65 or, more preferably, at least 0.70, still more preferably, at least 0.80. Most preferred at least 0.90 or 0.95.

In the context of EL devices having a plurality of EL elements, this is referred to as the within-pixel (or intra-pixel) thickness uniformity, specifically the 20%-within-pixel thickness uniformity.

Additionally, the multi-pixel EL device must be capable of displaying an image substantially uniform in intensity across its entire display area. Non-uniformity in intensity can result from differences in the average thickness between different pixels which, in the context of the invention, is referred to as the between-pixel (or inter-pixel) thickness uniformity. Dependent on the particular application of the EL device, thickness variations as small as 3.% may be discernable to the human unaided eye. The between-pixel thickness uniformity, defined as the relative thickness variation in the average thickness of the EL layers of all the EL elements, is suitably less than 10% or preferably less than 5% or even more preferably less than 3% if the EL device is driven at a constant current.

Each EL element comprises at least a first and a second electrode and an organic EL layer. Suitably, a single (composite) relief pattern is used for containing the fluid layers of every EL element. The plurality of first electrodes is provided in the form of a first, if required patterned, electrode layer. Similarly, the plurality of second electrodes is provided in the form of a second, if required patterned, electrode layer. In general, an area active in light emission is formed only in the area of overlap of a first electrode, a second electrode and an organic EL layer. If desired and/or appropriate, the first and the second electrodes of neighboring EL elements may have a common first electrode or a common second electrode respectively. Moreover, if neighboring EL elements have EL layers of the same EL material, their corresponding fluid layers may be combined in a single common fluid layer. If a common fluid layer is used, a single proportion is evaluated from the entire common EL layer and assigned to each of its EL elements. A multi-color EL device is obtained if EL materials of different colors for different EL elements are used. Full-color displays comprise a plurality of EL elements emitting either red, green or blue light.

In a (multi-color) segmented display device, either the first or second electrodes of all EL elements may be combined to form a common first or second electrode layer respectively.

In a matrix display of the active type EL elements are driven by means of, for example, a thin film transistor. An EL layer common to all EL elements may be used.

In a matrix display device of the passive type, the first and second electrodes of the EL elements are combined to form a plurality of row and column electrodes respectively which cross each other at right angles. Wherever a row and a column electrode cross each other, an EL element is formed. If the column electrodes are patterned by means of a built-in relief pattern, the relief pattern has an overhanging section. Since this relief pattern is provided prior to the deposition of the EL layer(s), the EL layers are at least patterned accordingly. As a result, all EL elements in the same column have a common EL layer.

Additionally, the relief pattern may, at right angles to the relief pattern used to pattern the column electrodes, comprise a second relief pattern with a rectangular or trapezoidal (broad base facing the first electrode) transverse profile which patterns the EL layer but not the second electrode layer. In case of a multi-color EL device, the color of EL elements within a row is the same. In general, due to the choice of materials of the first and second electrodes, the conductivity of the second electrode material is higher than the conductivity of the first electrode this configuration is preferred.

In another aspect, the invention relates to a method of manufacturing an electroluminescent device. The method comprises the steps of:

a) providing a first electrode, b) providing a relief pattern for containing a fluid layer from which an organic electroluminescent layer provided in accordance with a desired pattern is obtainable, c) depositing a fluid layer contained by the relief pattern, d) obtaining, from the fluid layer, the organic electroluminescent layer provided in accordance with the desired pattern, wherein the relief pattern and the fluid layer mutually interact such that the electroluminescent layer is substantially uniform in thickness to the extent that the proportion of the organic electroluminescent layer having a thickness within 20% of the minimum thickness of the organic electroluminescent layer or the proportion of the organic electroluminescent layer having a thickness within 20% of the maximum thickness of the organic electroluminescent layer, is at least 0.55, and e) providing, on the organic electroluminescent layer, a second electrode.

The method in accordance with the invention provides EL devices having an improved service life.

Service life improves even more if either of the said proportions is at least 0.60 or, preferably, at least 0.65 or, more preferably, at least 0.70, still more preferably, at least 0.80. Most preferred at least 0.90 or 0.95.

Suitable first and second electrodes, organic EL layers, organic electroluminescent materials, fluid layers and relief patterns as well as specific methods for providing these entities are disclosed hereinabove.

The mutual interaction of the relief pattern and the fluid layer determines the thickness profile of the EL layer. An important parameter which can be used to adapt the mutual interaction is the wettability of the fluid layer with respect to the surface of the relief pattern. The wettability is determined by the extent to which the relief pattern surface is hydrophobic or hydrophilic with respect to the fluid layer. The wettability of the fluid can be adapted by conventional means such as means for changing the viscosity, contact angle or visco-elasticity of the fluid layer or by adding surfactants or other agents which affect the rheological and interfacial properties of the fluid layer. The wettability of the relief pattern can be modified by selecting a different relief material or by subjecting a relief pattern to a surface treatment such as an TV/ozone treatment. If the wettability of the fluid with respect to the relief pattern is selected such that the surface of the fluid layer adopts a substantially planar meniscus, the electroluminescent layer is substantially uniform in thickness in the sense defined above.

In the above case of a planar meniscus the height of the relief pattern is not critical. In other cases it has been found that the height of the relief pattern is an important parameter determining the mutual interaction between the relief pattern and the fluid layer. This observation may be put to use in the method in accordance with the invention by requiring that the relief pattern used has a height selected such that the electroluminescent layer is substantially uniform in thickness in the sense defined above.

The initial concentration of the organic EL material or precursor thereof in the fluid layer is in the range 0.01 to 5%, preferably, 0.05 to 2%, or more preferably, 0.1 to 1%, all percentages by weight.

A preferred embodiment of the method according to the invention is characterized in that the relief pattern has a height selected such that, while reducing the volume of the fluid layer during the execution of step d), the fluid layer gels when the fluid surface is approximately level with the top of the relief pattern.

The preferred method has the advantage of being simple and generally applicable since it is applicable irrespective of the properties of the relief pattern surface and irrespective of the properties of the fluid layer with the exception of the concentration at which the fluid layers gels.

If the relief pattern is a composite relief pattern of the type described above, the fluid should gel when it is level with the relief pattern for containing the fluid layer which is the first relief pattern.

In the context of the invention, the fluid layer gels when it reaches its gel concentration which is the concentration at which the viscosity of the fluid is such that it is substantially not able to flow anymore when subjected to a shearing stress which typically occurs during the process of obtaining the EL layer from the fluid layer. Typically, such a shear stress is 0.5 Pa. The fluid is substantially unable to flow if it has a viscosity of 1 Pa.s or higher when subjected to this shearing stress. Since the viscosity of the fluid, at 0.5 Pa shear stress, is initially typically of the order of 10 mPA.s, the viscosity has increased by roughly a factor of hundred when it reaches its gel concentration. Those skilled in the art will appreciate that the numbers given are merely typical which in particular cases may need some adjustment in order to arrive at an EL layer having the required uniformity in thickness. In general, the composition of the fluid is chosen such that in the neighborhood of its gel concentration the viscosity increases by a factor of 5 to 10 or better 50 to 100 or more.

The gel concentration is easily measured by means of a rheometer using methods well known to those skilled in the art.

The gel concentration depends inter alia on the temperature and the exact composition of the fluid. Additives such as diluents, leveling agents and thickening agents can be used to manipulate the gel concentration.

In the context of this preferred embodiment, approximately means level enough so that the electroluminescent layer is substantially uniform in thickness in the sense defined above.

If the fluid is not able to flow anymore when it is level with the relief pattern there is no transport of fluid from the interior of the fluid towards the relief pattern or vice versa. Consequently, the fluid layer is unable to adopt its "natural" convex or concave meniscus.

Since the fluid is to gel when level with the relief pattern, the initial average height of the fluid layer when deposited is larger than the height of the relief pattern. Before being level with the relief pattern, the surface of the fluid layer has a convex shape and is pinned at the interface between "air" and the top of the relief pattern. The interface will remain pinned at least until it is level with the top of the relief pattern.

The height of the relief pattern is attuned to the gel concentration as follows. The desired layer thickness and area of the EL layer, denoted $t_{EL}$ and $A_{EL}$ respectively, are selected and the density of the EL layer $\rho_{EL}$ determined. If the fluid layer is to gel when it is level with the top of the relief pattern, then $c_{ini}h_{ini}=c_{gel}h_{rp}=\rho EL'EL$, where $c_{gel}$ is the gel concentration, $h_{rp}$ is the height of the relief pattern, $c_{ini}$ is the initial concentration of the (precursor) EL or other material in the fluid layer and $h_{ini}$ is the initial average height of the fluid layer ($h_{ini}=V_{ini}/A_{EL}$, where $V_{ini}$ is the initial volume of the fluid layer). Among the four parameters $c_{ini}$, $h_{ini}$, $c_{gel}$, and $h_{rp}$ there are two degrees of freedom.

In a preferred embodiment of the method according to the invention the fluid layer is selectively deposited by means of ink-jet printing.

Ink-jet printing is a cost-effective and accurate method to provide organic EL layers selectively, and is particularly suitable when a multi-color EL device is to be manufactured. The presence of the relief pattern allows the ink drops to be provided even more accurately even if the wettability of the ink drop and surface upon which the ink drop is deposited would be such that the ink drop shows a tendency to spread across a large surface.

Ink-jetting can be suitably used to deposit a fluid layer having, when deposited, a larger height than the height of the relief pattern. As such it is particularly advantageous if used in combination with the above-mentioned preferred method in which the fluid layer gels when it is approximately level with the top of the relief pattern.

Furthermore, since ink-jet printing allows the volume of the ink drops to be reproduced very reliably, the volume of the fluid layer of each EL element of an EL device having a plurality of EL elements is substantially constant. As a result, a favorable between-pixel thickness uniformity can be realized.

In a further preferred embodiment of the method, the fluid layer is selectively deposited by means of dispensing a continuous jet of the fluid.

Dispensing a continuous jet of fluid from a capillary has substantially the same attractive properties as ink-jet printing. Additionally, however it has the advantage that in terms of the theological properties needed to enable dispensing or ink-jet printing, dispensing is less demanding than ink-jet printing. Dispensing is therefore applicable to a wider range of fluids. In particular, it can be suitably used to deposit fluids which have an extension of viscosity so large that they cannot be ink-jet printed. This in particular applies to many solutions comprising electroluminescent poly-p-phenylenevinylenes.

In a further preferred embodiment of the method according to the invention, the fluid layer is non-selectively deposited.

Although ink-jet printing and dispensing are preferred methods for depositing an organic EL layer, application thereof is relatively time-consuming because the deposition process is basically a serial process. In case a single-color EL device is to be manufactured or a multi-color device which comprises an additional layer common to all EL elements, preferably the fluid layer corresponding to the single-color EL layer or additional layer is deposited non-selectively. Examples of non-selective deposition techniques include dip coating, Langmuir-Blodgett technique, spray-coating, and doctor-blade technique.

In a particularly preferred method, the fluid layer is deposited by means of spin-coating.

In general, spin-coating is a method suitable for coating a planar substrate or for providing a planarized layer on a relief patterned substrate. In contrast, as those skilled in the art will agree, one does not expect that is possible to reliably spin-coat a layer on a relief patterned substrate if the thickness of the layer to be provided is much less the height of the relief pattern. It was therefore quite unexpected, when it proved possible to provide an 100 nm EL layer over a relief pattern which is as much as 50 to a 100 times higher such that the electroluminescent layer is substantially uniform in thickness in the sense defined above. The service life of the EL device comprising this layer proved to be substantially identical to a reference device which not have the relief pattern but a substantially planar substrate.

Moreover, it proved possible to spin-coat all EL layers of a EL device having a plurality of EL elements simultaneously such that the between-pixel thickness uniformity is at least less than 10% or less which results in an excellent uniformity in intensity of emitted light.

Most uniform in thickness are EL layers in which the wettability between the fluid layer and the relief pattern is similar to the wettability between the fluid layer and the surface on to which the fluid layer is deposited. The wettability may be attuned using surface treatments known per se such as an oxygen-plasma or UV/ozone treatment.

Spin-coating is particularly advantageous if used in combination with a relief pattern having a transverse profile having an overhanging section for patterning the second electrode.

A preferred embodiment of the method is characterized in that the relief pattern has a height of 3 to 5 μm.

If the height of the relief pattern exceeds 5 μm the EL device may have an unfavorable between-pixel thickness uniformity of more than 10%. If the height is less than 3 μm, the spin-coating process is rather sensitive to particles which may be present in the fluid layer or relief pattern. Such particles may cause short circuits.

These and other aspects of the invention will be apparent from and elucidated with reference to the embodiments described hereinafter.

EMBODIMENT 1:

a) Device Structure

Figure 1:
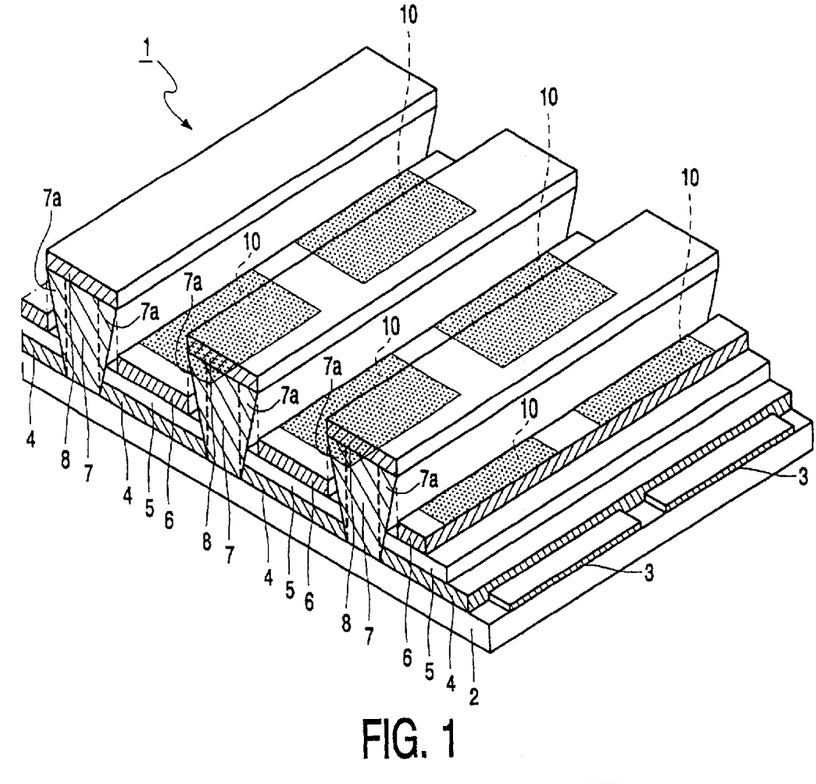
FIG. 1 schematically shows, in a partially worked-open perspective plan view, a part of an organic EL matrix display device in accordance with the invention.

FIG. 1 schematically shows, in a partially worked-open perspective plan view, a part of an organic EL matrix display device 1 in accordance with the invention.

The EL device 1 has a (with respect to the light to be emitted transparent) substrate 2 provided with a plurality of independently addressable EL elements (EL pixels) 10 formed by the area of overlap of a plurality of row electrodes 3, a plurality of hole-injecting layers 4 (which are inessential for the invention and may be left out), a plurality of EL layers 5 obtained from fluid layers (not shown), and a plurality of column electrodes 6. The EL layers 5 may be split in EL layers capable of emitting red, green and blue light respectively. Each of the EL layers 5 is a common EL layer providing the EL layer of the EL elements 10 within a particular column and is provided in accordance with a desired pattern which in the present embodiment is a stripe. Each row electrode 3 comprises a plurality of first electrodes of EL elements 10 and each column electrode 6 a plurality of second electrodes. The EL device 1 further comprises a relief pattern 7 for containing the fluid layers. The relief pattern 7 has negative slopes (its base being narrower than its top) creating overhanging sections 7a which render the composite relief pattern suitable for patterning the column electrodes 6 into mutually independently addressable column electrodes. The relief pattern 7 then functions as a built-in shadow mask. If the column electrodes are deposited by means of, for example, vacuum deposition of metal vapor the overhanging sections 7a create shadow regions with respect to a vapor flux directed at right angles to the substrate in which no material is deposited. In this manner column electrodes 6 are formed which are mutually electrically disconnected.

If the relief pattern 7 is used as a built-in shadow mask, non-functional electrode material 8 which has the same composition as the electrode material is present on top of the relief pattern. Depending on the specific method used to deposit the active layers 4 and/or 5, further layers (not shown) may be present on top of the relief pattern 7.

Although the EL layers 5 are drawn perfectly planar, their surface will be more or less curved near the relief pattern 7 due to the fact that they are obtained from fluid layers.

Figure 2:
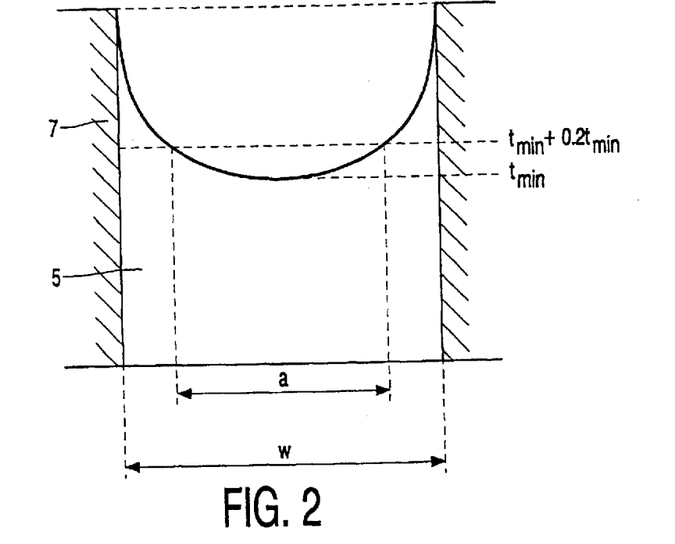
FIG. 2 shows, in a cross-sectional view, an example of a thickness profile of an organic electroluminescent layer obtained from a fluid layer contained by a relief pattern, FIG. 3 schematically shows, in a perspective plan view, a part of a further organic EL matrix display device in accordance with the invention, FIG. 4 schematically shows, in a cross-sectional view, a deposited fluid layer contained by a relief pattern and typical examples EL layers obtained therefrom, FIGS. 5 and 6 each show graphs of the measured viscosity η(in Pa.s) as a function of the shear stress π(in Pa) at two different concentrations, and FIGS. 7, 8 and 9 each show a graph of the measured thickness t (in μm) as a function of the position w (in μm) of an ink-jet printed layer provided between the lines of a relief pattern.

FIG. 2 shows, in cross-sectional view, an example of a thickness profile of an organic electroluminescent layer 5 obtained from a fluid layer (not shown) and a relief pattern 7 for containing the fluid layer. Within the section labeled a, the EL layer has a thickness within 20% of the minimum thickness $t_{min}$. The proportion of the EL layer having a thickness within 20% of the minimum thickness $t_{min}$ is then a/w where w is the width of the layer 5. If FIG. 2 is considered to be drawn to scale, the proportion is approximately 0.70. The proportion of the EL layer having a thickness within 20% of the maximum thickness is defined similarly.

b) Example of Manufacture

A substrate 2 of 1.1 mm thick sodalime glass coated with a 15 Ω/square 150 nm thick ITO layer (Balzers) is provided and the ITO layer patterned in a 280 μm wide lines and 30 μm wide spaces pattern in a conventional manner to obtain the first electrodes in the form of row electrodes 3 which serve as the anodes of the EL elements 10.

The substrate is then spin-coated (1000 rpm) with a layer of the image reversal photoresist AZ5218-e (AZ Hoechst). The photoresist is exposed pattern-wise using a mask having a 20/290 μm lines/spaces pattern at right angles to the row electrodes 3 in proximity (40 μm gap) with a dose of 32 mJ/cm², hard-baked at 110° C. for 10 min, flood exposed with a dose of 400 mJ/cm², developed using a 1:1 AZ-developer: DI-water developer for a time sufficient to obtain a negative slope of 45°, and post-baked at 100° C. for 15 min. This results in a 30/280 μm lines/spaces relief pattern 7 of which the spaces are positioned over the ITO electrodes. Each line has an inverted trapezoidal shape which measures 30 μm at the top and 20 μm at the base. The height of the relief pattern 7 is 5.0 μm.

A water-based poly-3,4-ethylenedioxythiophene (PEDOT) solution of 3% solid content (supplier Bayer) is then spin-coated over the relief pattern at 2000 rpm resulting in a wet layer of average thickness 8.3 μm. While spinning at 2000 rpm, the wet layer is dried at 130° C. for 3 min, resulting in a plurality of hole-injecting (hole-transport, electrode) layers 4 of PEDOT having a thickness of 250 nm and a square resistance of 100 MΩ/square.

Subsequently, a 0.6% by weight solution of the polymer of formula (1)

(1)

wherein—$OC_{10}$ designates 3,7-dimethyloctyloxy, r and 1-r equal 0.5 and indicate the proportion of units having the structure indicated in brackets, to which, respectively, r and 1-r is suffixed (hereinafter also referred to as NRS—PPV) in toluene is spin-coated at 1250 rpm which results in a fluid layer of average thickness 11.6 μm. The copolymer is synthesized according to a similar method in WO 99/21936. After drying the wet layer, a plurality of organic EL layers 5 of NRS—PPV having an average thickness of 70 nm is obtained.

While using the relief pattern 7 as a built-in shadow mask, 3 nm thick Ba and 200 nm thick Al layers are successively deposited on top of the EL layers 5. The patterned Ba/Al layers thus obtained constitute the plurality of column electrodes (cathodes) 6.

The EL device thus obtained is packaged in a housing which is sealed with epoxy-based glue (Araldite). Inside the housing a quantity of BaO is provided which serves as a getter for water.

c) Reference EL Device

The reference EL device is similar to the device 1 but does not have the relief pattern 7. Also, the electrodes 3 and 6 are not patterned. This results in a back-light device having a single first and second electrode. Importantly, the reference device has the same total surface area as the EL device 1 but a larger light-emitting area since it does not have a relief pattern and its electrodes are not patterned. The proportion of the EL layer having a thickness within 20% the minimum/maximum thickness approaches 1.0.

d) Device Characteristics

With the anodic electrodes 3 of the EL device 1 connected to the positive pole of a direct voltage supply and the cathodic electrodes 6 connected to the negative pole thereof, the EL device 1 as manufactured above under b) is subjected to a service-life test performed at 70° C./50% relative humidity (RH) in which the device is driven at a constant current and an initial voltage 2.7 V.

Initially, individual EL elements 10 each emit at a brightness of 300 $Cd/m^2$.

The service life, defined as the time within the brightness drops by 50% of its initial value when the device is driven at a constant current, is about 80 h. By that time the voltage required to keep the current constant has risen to 4.0 V.

The reference EL device as described under c) is subjected to a similar service-life test performed at 80° C./50% RH. Initially, the reference EL device emits at a brightness of 75 $Cd/m^2$. Its service-life, defined as the time within the brightness drops by 50% of its initial value when the device is driven at a constant current, is about 130 h. By extrapolating the temperature- and intensity-dependency of the service life this corresponds to a service life of about 75 h at 300 $Cd/m^2$ and 70° C./50% RH.

Clearly, the service life of the EL device 1 is substantially identical to that of the reference EL device. Thus, the thickness of the EL layer 5 within each particular EL element 10 is, in the context of the invention, substantially uniform.

This is corroborated by measurements of the thickness profile of EL layers 5 of individual EL elements 10. The thickness profile is such that the 20%-within-pixel thickness uniformity at 20% is at least 0.88, whereas the 40%-within-pixel thickness uniformity is at least 0.99.

The between-pixel thickness uniformity of the EL device 1 was measured by first locating any deformations of the spin-coated layers which are of macroscopic size that is which span many pixels by means of optical inspection in reflection and absorption. If present, such deformations often take the form radially outward projecting streaks. Using a DEKTAK or alpha-stepper the difference in thickness associated with a deformation was then measured. No difference in thickness could be observed. Consequently, the between-pixel thickness uniformity must be less than the relative accuracy of the measurement method used, the relative accuracy being a few (2 to 3) percent.

The within- and between-pixel thickness uniformity of the poly-3,4-ethylenedioxythiophene layer is similar to that of the NRS—PPV layer.

EMBODIMENT 2:

Embodiment 1 is repeated with the difference that the EL layer 5, instead of NRS—PPV, contains the green light emitting copolymer of formula (2)

(2)

wherein—$OC_4$ designates 2-methylpropoxy and r=1-r=0.50 and defined as above.

The results of the service life test show that the service life of the EL device is substantially identical to that of its corresponding reference EL device. Thus, the thickness of the EL layer 5 within each particular EL element 10 is, in the context of the invention, substantially uniform.

This is corroborated by measurements of the thickness profile of EL layers 5 of individual EL elements 10. The thickness profile is similar to that obtained in embodiment 1. The between-pixel thickness uniformity of the EL device of this embodiment was found to be less than a few percent.

EMBODIMENT 3:

Embodiment 1 is repeated with relief patterns 7 having different heights. In table 1 the results with respect to the 20% and 40% within-pixel uniformity of the EL layer 5 and the hole-injecting layer 4 are summarized and in table 2 the between-pixel uniformity results.

TABLE 1

| Height of relief pattern (μm) | within-pixel thickness uniformity | | | |
| --- | --- | --- | --- | --- |
| | 20% | | 40% | |
| | NRS-PPV | PEDOT | NRS-PPV | PEDOT |
| 3.0 | 0.90 | 0.95 | >0.99 | >0.99 |
| 5.0 | 0.88 | — | >0.99 | — |
| 8.0 | 0.70 | 0.44 | 0.76 | 0.60 |
| 10.0 | 0.45 | 0.38 | 0.57 | 0.50 |
| 15.0 | 0.38 | 0.35 | 0.51 | 0.48 |

From Table 1 it is clear that if, for example, the 20% within-pixel thickness uniformity is to be at least 0.55 the relief pattern should not be higher than about 9 and 7 μm for the NRS—PPV and PEDOT layer respectively. In the present embodiment the initial average thickness of the fluid layer is about 13 μm for the NRS—PPV layer and about 8 μm for the PEDOT layer. Thus, apparently in spin-coated layers the height of the relief pattern should certainly not be larger than the initial average height of the fluid layer or, more conservatively, the height of the relief pattern should not be larger than half the initial average fluid layer thickness.

TABLE 2

| Height of relief pattern (μm) | between-pixel thickness uniformity (%) | |
| --- | --- | --- |
| | NRS-PPV | PEDOT |
| 1.1 | <2–3 | <2–3 |
| 1.9 | <2–3 | <2–3 |
| 3.3 | <2–3 | <2–3 |
| 4.5 | <2–3 | <2–3 |
| 5.9 | 5–10 | 5–10 |
| 7.6 | >10 | 5–10 |
| 10.8 | >10 | >10 |
| 15.5 | >10 | >10 |

From Table 2 the height of the relief pattern can be selected so as to arrive at a suitable between-pixel thickness uniformity. Apparently, if the height is less than about 5 μm the between-pixel uniformity, for both the PEDOT and NRS—PPV layer, is <2–3% which is of the order of the accuracy of the method used to obtain this percentage.

Figure 3:
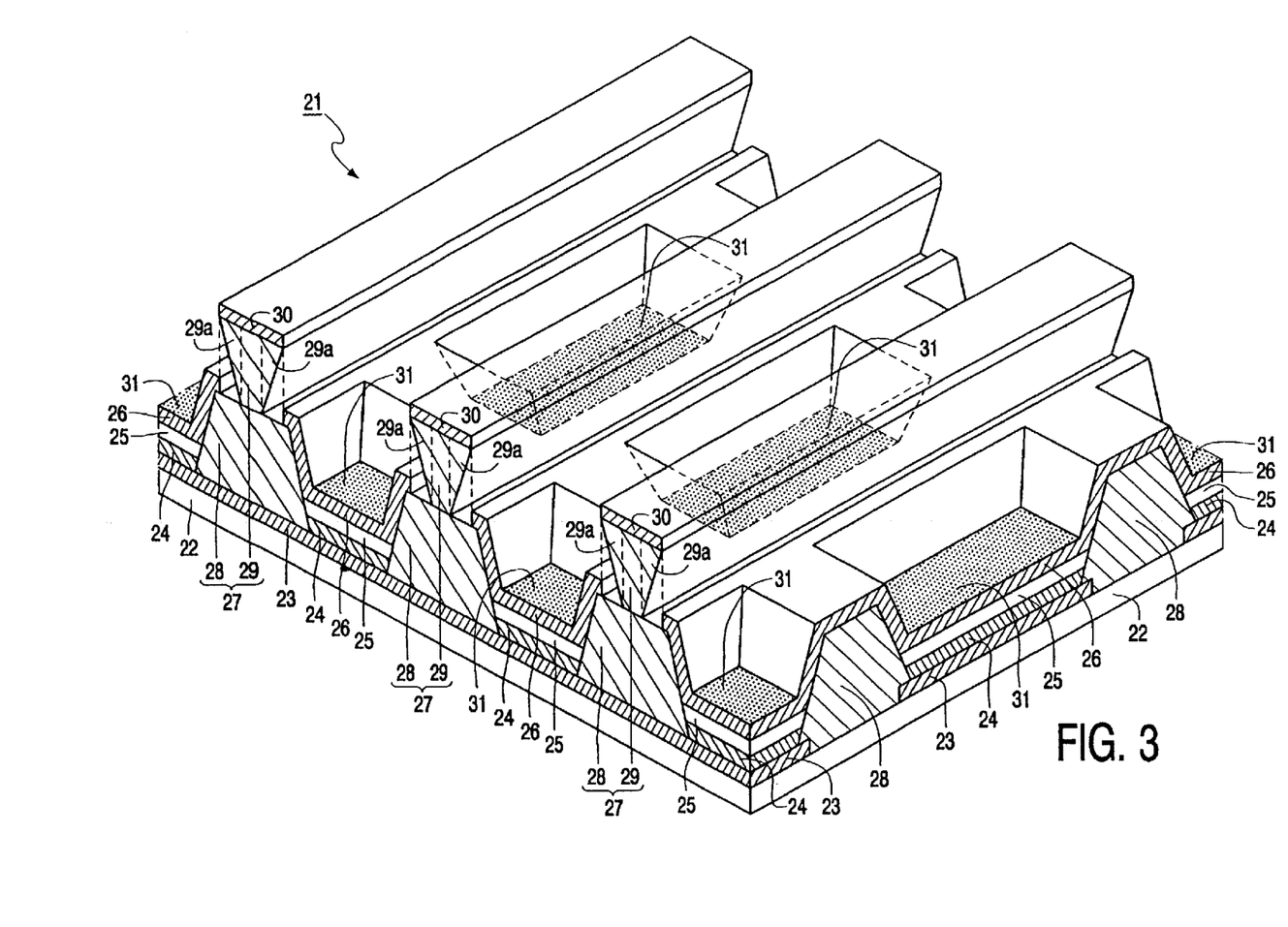

EMBODIMENT 4:

FIG. 3 schematically shows, in a perspective plan view, a part of a further organic EL matrix display device 21 in accordance with the invention. The EL device 21 has a (transparent) substrate 22 provided with a plurality of independent addressable EL elements (EL pixels) 31 formed by the area of overlap of a plurality of row electrodes 23, a plurality of hole-injecting layers 24 (which are inessential for the invention and may be left out), a plurality of EL layers 25 obtained from fluid layers 30 (not shown), and a plurality of column electrodes 26. The EL layers 25 may be split in EL layers capable of luminescing red, green and blue light respectively in order to obtain a multi-color device. Each of the EL layers 25 is a common EL layer providing the EL layer of EL elements 31 within a particular column. Each row electrode 23 comprises a plurality of first electrodes of EL elements 31 and each column electrode 26 a plurality of second electrodes.

The EL device 21 further comprises a composite relief pattern 27. The composite relief pattern has a first relief pattern 28 for containing the fluid layers. The relief pattern 28 has positive slopes (its base being broader than its top) which guarantees that the column electrodes 26 can be provided as continuous conducting strips.

The composite relief pattern 27 further comprises a second relief pattern 29 having overhanging sections 29a which render the composite relief pattern suitable for patterning the column electrodes 26 into mutually independently addressable column electrodes. The second relief pattern 29 is provided on top of the first relief pattern 28, that is on the surface of the first relief pattern which faces away from the row electrodes 23. If, for example, the column electrodes 26 are deposited by means of vacuum deposition of metal vapor the overhanging sections 29a create shadow regions with respect to a vapor flux directed at right angles to the substrate in which no material is deposited whereas the positively sloped first relief pattern 28 does not provide such a shadow region. In this manner column electrodes 26 are formed which are mutually electrically disconnected.

If the relief pattern 29 is used as a built-in shadow mask non-functional material 30 is present on top of the relief pattern. Depending on the specific method used to deposit the active layers 24 and/or 25, further layers (not shown) may be present on top of the relief pattern 27.

Although the EL layers 25 are drawn perfectly planar, their surface will be more or less curved near the relief pattern 27 due to the fact that they are obtained from fluid layers.

EMBODIMENT 5:

As an alternative to spin-coating, the fluid layers (FIG. 1) can be deposited selectively using an ink-jet printing method or by means of dispensing a continuous jet of fluid in which case the ink-jet head or dispensing capillary is moved parallel to the lines of the relief pattern, while filling the spaces between the lines of the relief pattern. Subsequently, the fluid layers are converted into the corresponding EL or additional organic layers 5. In a similar manner EL layers 5 can be selectively deposited which may have different colors so as to obtain a multi-color device.

Figure 4:
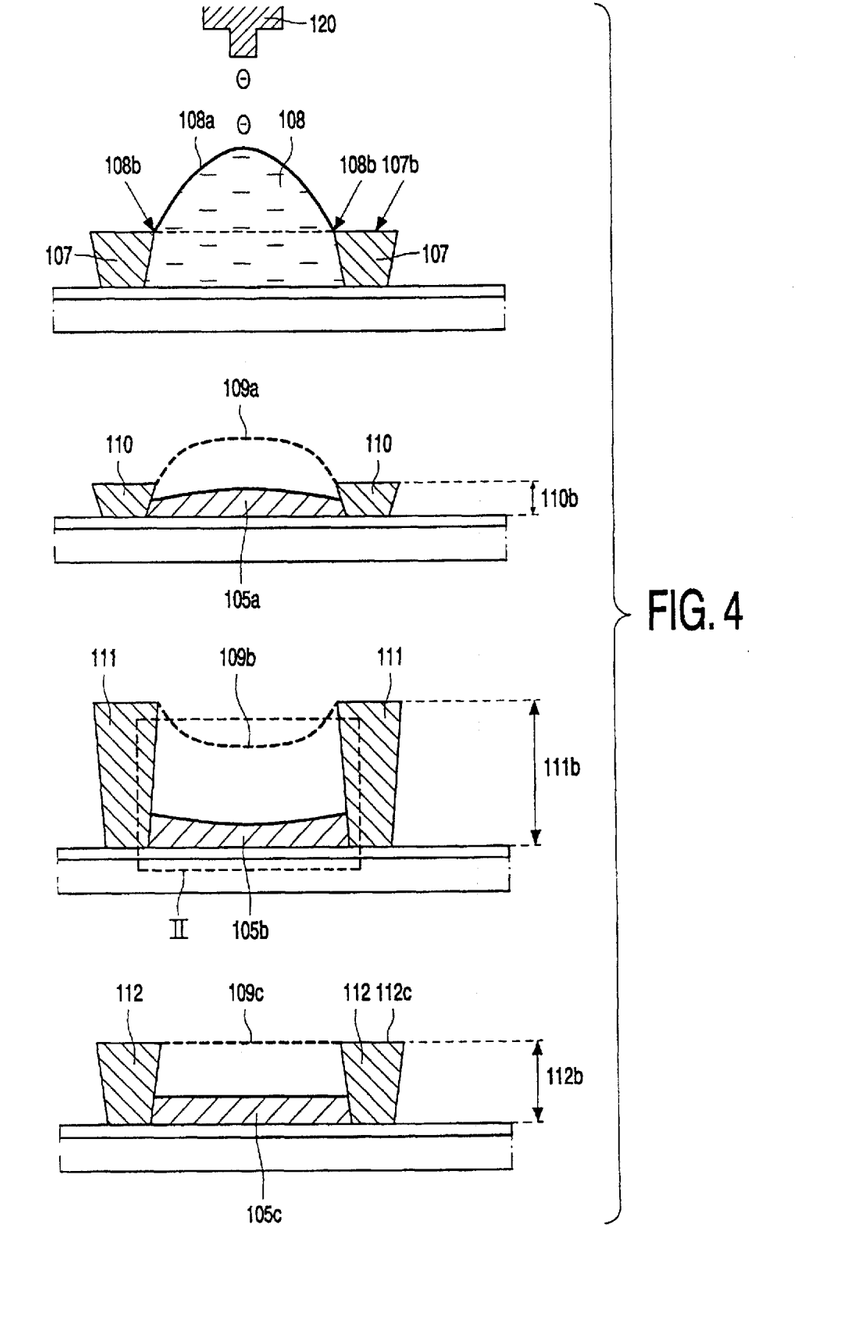

FIG. 4 shows, schematically, a fluid layer 108 selectively deposited by means of ink-jet head 120 and contained by a relief pattern 107 and EL or additional organic layers 105a, 105b and 105c typically obtained from a fluid layer 108. The fluid layer has a surface 108a. In this example, the wettability of the fluid layer 108 with respect to the relief pattern is such that the fluid would like to adopt a concave meniscus. However, since the volume of the fluid layer 108 is larger than the volume of the space between the lines of the relief pattern 107 the fluid surface 108a is initially convex.

During the early stages of the process of converting the fluid layer into the EL layer the fluid surface 108a is pinned at the top of the relief pattern 107c at the location 108b until the fluid surface is level therewith. In phantom are shown the fluid surfaces 109a, 109b, 109c which correspond to the stage at which the fluid layer 108 may typically reach its gel concentration.

In the case of the EL or additional layer 105a, the height 110b of the relief pattern 110 is selected too small so that the fluid layer gels too early resulting in a convex fluid surface 109a. Since beyond the gel concentration the fluid is unable to flow the surface of the EL layer 105a has a similar convex shape.

In the case of the EL or additional layer 105b, the height 111b of the relief pattern 111 is selected too large so that the fluid layer gels too late resulting in a concave fluid surface 109b. Since beyond the gel concentration the fluid is unable to flow the surface of the EL layer 105b has a similar concave shape. FIG. 2 shows schematically an exploded view of the region II.

In the case of the EL or additional layer 105c, the height 112b of the relief pattern 112 is selected such that the fluid layer gels when it is approximately level with the top of the relief pattern 112c resulting in an approximately level fluid surface 109c. Since beyond the gel concentration the fluid is unable to flow the surface of the EL layer 105c has a similar level shape.

The typical ink jet printed layers 105a, 105b and 105c can be manufactured, for example, by means of an ink-jet printer having a single nozzle piezoelectric ink-jet head with a nozzle diameter of 50 μm (supplier Microdop GmbH).

The substrate to be provided with the inkjet-printed layer may be for example an ITO coated glass substrate having a photoresist relief pattern in the form of a lines and space pattern, the photoresist being for example AZ 4562 marketed by Hoechst.

The lines of the relief pattern are 50 μm wide and the spaces 260 μm. With respect to the ink-jet printing process the size of the overhanging section is negligible. In order to improve the wettability of the ITO coated glass substrate with respect to the liquid to be deposited, the substrate is exposed to an argon plasma for 2 minutes.

The distance from the substrate to the nozzle of the ink-jet head is set to 0.5 to 1 mm and the ink-jet head is moved parallel to the lines of the relief pattern while being positioned above the middle of the space between the lines to be filled.

The initial average height of the fluid layer deposited by the ink-jet head $h_{ini}$ equals f V/UB, wherein f is the ink drop firing frequency, V is the ink drop volume, U is the speed of the substrate with respect to the ink-jet head and B is the width of the space between the lines.

The fluid to be deposited (the ink) is a solution of poly-3,4-ethylenedioxythiophene in water (supplier Bayer AG). With respect to the relief pattern the ink would adopt a concave meniscus.

The gel concentration is determined by means of a constant stress rheometer (Rheometrics SR 5000).

Figure 5:
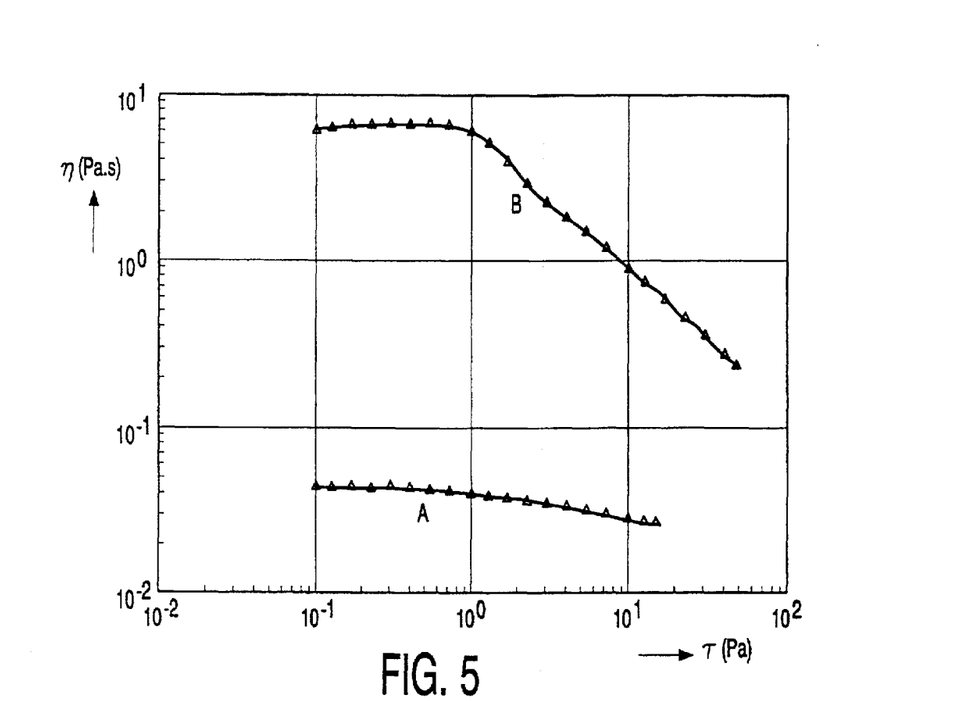
Figure 6:
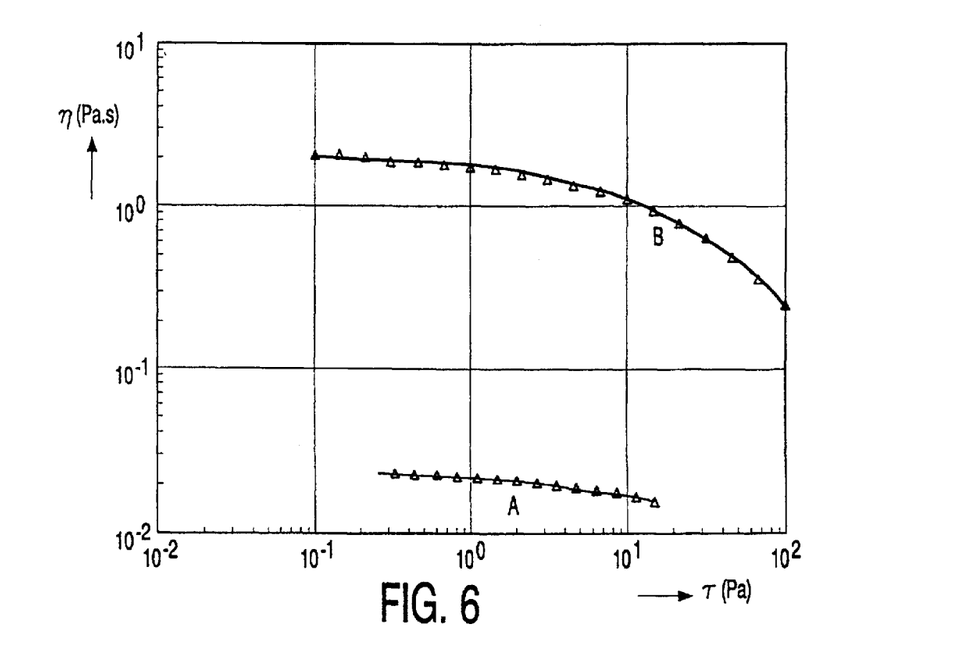

FIGS. 5 and 6 each show a graph of the measured viscosity η(in Pa.s) as a function of the shear stress π(in Pa) at different concentrations.

FIG. 5 relates to the above solution of PEDOT. The curve labeled A corresponds to the concentration as supplied and used above for spin-coating. The curve labeled B corresponds to a solution at a two times higher concentration. At a shear atress of 0.5 Pa the viscosity is 0.04 and 5 Pa.s for curve A and B respectively. The PEDOT solution gels when its volume is reduced to one half the original volume or, equivalently, when the ratio of the gel concentration $c_{gel}$ and the initial concentration of the PEDOT solution $c_{ini}$, defined as $c_{gel}/c_{ini}$ is approximately 2.

FIG. 6 relates to the NRS—PPV solution. Curve A corresponds to a solution of 0.6% by weight and curve B to a solution having a four times higher concentration. The latter concentration is the gel concentration $c_{gel}$.

If, in accordance with a preferred embodiment of the invention, a fluid layer is to gel when the fluid surface is level with the top of the relief pattern, the equation $c_{ini}h_{ini}=c_{gel}h_{rp}$ holds. It then follows that in the case of PEDOT where $c_{gel}=2c_{ini}$, substantially planar layers are obtained if $h_{ini}=2h_{rp}$.

In a first example of an inkjet printed layer, the height of the relief pattern is 20 μm, the speed U is 0.01 m/s, the drop volume V is 113 pl, the firing frequency f is 590 Hz and the space width B is 260 μm resulting in an initial average height of the fluid layer $h_{ini}$ of about 25 μm.

Figure 7:
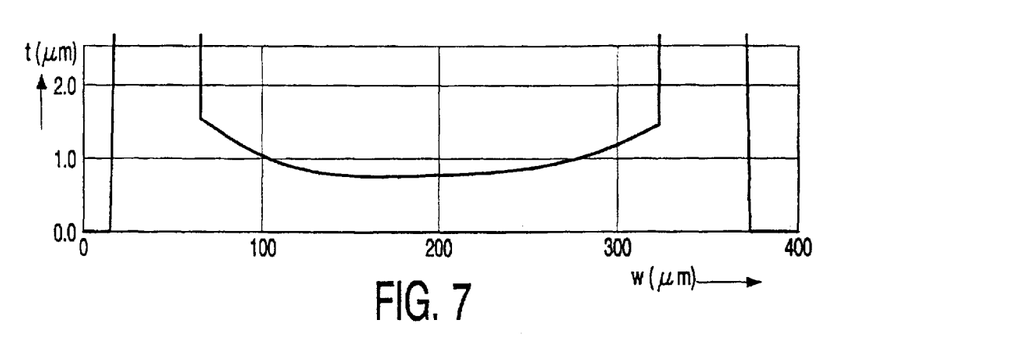

FIG. 7 shows a graph of the measured thickness t (in μm) as a function of the position w (in μm) of the ink-jet printed layer provided between the lines of the relief pattern. Only a base section of the relief pattern is shown. The positions correspond to a cross-section at right angles to the lines of a lines and spaces relief pattern.

The proportion of the ink-jetted layer having a thickness within 20% of the minimum thickness of the ink-jetted layer is 0.52 whereas the proportion of the ink-jetted layer having a thickness within 40% of the minimum thickness of the ink-jetted layer is 0.76.

Furthermore, the thickness profile has a concave shape which is consistent with the fact that $h_{ini}=1.5h_{rp}$ which means that the gel concentration is reached too late or, put differently, the height of the relief pattern is too large.

In a second example of an ink-jet printed layer, the height of the relief pattern is 1.5 μm, the speed U is 0.01 m/s, the drop volume V is 150 pl, the firing frequency f is 200 Hz and the space width B is 280 μm resulting in an initial average height of the fluid layer $h_{ini}$ of about 10.5 μm.

Figure 8:
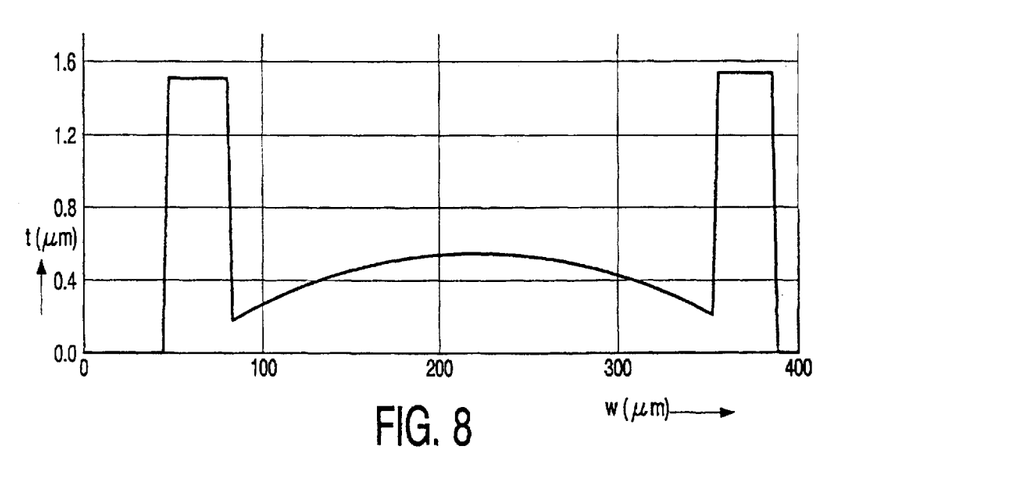

FIG. 8 shows a graph of the measured thickness t (in μm) as a function of the position w (in μm) of the ink-jet printed layer of this second example.

The proportion of the layer having a thickness within 20% of the maximum (the profile is convex!) thickness is 0.46 whereas the proportion of the layer having a thickness within 40% of the maximum thickness is 0.63. The proportion corresponding the minimum thickness is far lower.

Thus, the height of the relief pattern is selected not in accordance with the invention.

Furthermore, the profile has a convex shape which is consistent with the fact that $h_{ini}=7h_{rp}$ which means that the gel concentration is reached too early or, put differently, the height of the relief pattern is too small.

In a third example of an ink-jet printed layer, the height of the relief pattern is 5.4 μm, the speed U is 0.03 nm/s, the drop volume V is 150 pl, the firing frequency f is 500 Hz and the space width B is 275 μm resulting in an initial average height of the fluid layer $h_{ini}$ of about 9.10 μm.

Figure 9:
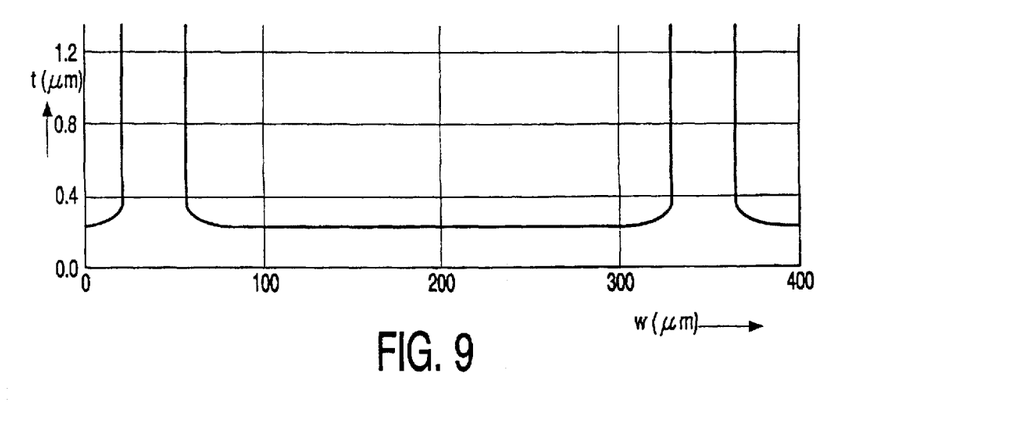

FIG. 9 shows a graph of the measured thickness t (in μm) as a function of the position w (in μm) of the ink-jet printed layer of this third example.

The proportion of the ink-jetted layer having a thickness within 20% of the minimum thickness of the ink-jetted layer is at least 0.95 whereas the proportion of the ink-jetted layer having a thickness within 40% of the minimum thickness of the ink-jetted layer is approaches unity.

Thus, the height of the relief pattern is selected in accordance with the invention.

Furthermore, $h_{ini}=1.7h_{rp}$ (theoretically $h_{ini}=2.0h_{rp}$ see above) which means that the fluid layer gels when the fluid surface is approximately level with the top of the relief pattern.

What is claimed is:

1. An organic electroluminescent device having at least one electroluminescent element comprising a first and a second electrode and, disposed therebetween, an organic electroluminescent layer provided in accordance with a desired pattern and obtained from a fluid layer, the device further having a relief pattern for containing the fluid layer from which the organic electroluminescent layer provided in accordance with the desired pattern is obtained, characterized in that the electroluminescent layer is substantially uniform in thickness to the extent that the proportion of the organic electroluminescent layer having a thickness within 20% of the minimum thickness of the organic electroluminescent layer or the proportion of the organic electroluminescent layer having a thickness within 20% of the maximum thickness of the organic electroluminescent layer, is at least 0.55 and less than 1.0.

2. An organic electroluminescent device as claimed in claim 1, characterized in that the relief pattern or a part thereof has a transverse profile having an overhanging section rendering the relief pattern suitable for patterning the second electrode.

3. An organic electroluminescent device as claimed in claim 2, characterized in that the relief pattern is a composite relief pattern of a first relief pattern for containing the fluid layer and a second relief pattern having an overhanging section rendering the second relief pattern suitable for patterning the second electrode.

4. An organic electroluminescent device as claimed in claim 1, characterized in that the organic electroluminescent device comprises a plurality of independently addressable electroluminescent elements.

5. A method of manufacturing an organic electroluminescent device having at least one electroluminescent element, said method comprising the steps of:
   a) providing a first electrode,
   b) providing a relief pattern for containing a fluid layer from which an organic electroluminescent layer provided in accordance with a desired pattern is obtainable,
   c) depositing a fluid layer contained by the relief pattern,
   d) obtaining, from the fluid layer, the organic electroluminescent layer provided in accordance with the desired pattern, wherein the relief pattern and the fluid layer mutually interact such that the electroluminescent layer is substantially uniform in thickness to the extent that the proportion of the organic electroluminescent layer having a thickness within 20% of the minimum thickness of the organic electroluminescent layer or the proportion of the organic electroluminescent layer having a thickness within 20% of the maximum thickness of the organic electroluminescent layer, is at least 0.55 and less than 1.0, and
   e) providing, on the organic electroluminescent layer, a second electrode.

6. A method as claimed in claim 5, characterized in that the relief pattern has a height selected such that, while reducing the volume of the fluid layer during the execution of step d), the fluid layer gels when the fluid surface of the fluid layer is approximately level with the top of the relief pattern.

7. A method as claimed in claim 5, characterized in that the fluid layer is selectively deposited by means of ink-jet printing.

8. A method as claimed in claim 5, characterized in that the fluid layer is selectively deposited by means of dispensing a continuous jet of the fluid.

9. A method as claimed in claim 5, characterized in that the fluid layer is deposited by means of spin-coating.

10. A method as claimed in claim 9, characterized in that the relief pattern has a height of 3 to 5 μm.

* * * * *